United States Patent
Ebisawa et al.

(12) 
(10) Patent No.: US 6,284,342 B1
(45) Date of Patent: Sep. 4, 2001

(54) ORGANIC EL DISPLAY ASSEMBLY

(75) Inventors: Akira Ebisawa; Osamu Onitsuka; Hiroyuki Endo; Masayuki Kawashima; Toshio Hayakawa, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/330,059

(22) Filed: Jun. 11, 1999

(30) Foreign Application Priority Data

Jun. 12, 1998 (JP) .................................................. 10-181458

(51) Int. Cl.$^7$ ..................................................... H05B 33/04
(52) U.S. Cl. .............................. 428/69; 428/76; 428/690; 428/917; 313/512
(58) Field of Search ........................... 313/512; 428/690, 428/917, 68, 69, 76, 194; 252/188.26; 257/100

(56) References Cited

U.S. PATENT DOCUMENTS

| | | | |
|---|---|---|---|
| 5,048,301 | * | 9/1991 | Sabin et al. ............................. 62/101 |
| 5,909,081 | * | 6/1999 | Eida et al. ............................. 313/504 |

FOREIGN PATENT DOCUMENTS

| | | |
|---|---|---|
| 0 776 147 | 5/1997 | (EP) . |
| 0 859 539 | 8/1998 | (EP) . |
| 3-261091 | 11/1991 | (JP) . |
| 5-36475 | 2/1993 | (JP) . |
| 5-89959 | 4/1993 | (JP) . |
| 6-176867 | 6/1994 | (JP) . |
| 7-169567 | 7/1995 | (JP) . |
| 9-148066 | 6/1997 | (JP) . |
| 0914 8066 | * 6/1997 | (JP) . |
| 10-214683 | 8/1998 | (JP) . |
| 10-275679 | 10/1998 | (JP) . |

* cited by examiner

Primary Examiner—Alexander S. Thomas
(74) Attorney, Agent, or Firm—Oblon, Spivak, McClelland, Maier & Neustadt, P.C.

(57) ABSTRACT

An organic EL structure is received in a gas-tight casing to construct an organic EL display assembly. The organic EL structure includes a hole injecting electrode, an electron injecting electrode, and at least one organic layer disposed between the electrodes. A desiccant selected from calcium hydride, strontium hydride and a mixture thereof is disposed in the casing out of contact with the organic EL structure. This EL display assembly substantially eliminates the influence of moisture and has a long lifetime.

3 Claims, 1 Drawing Sheet

ORGANIC EL DISPLAY ASSEMBLY

This invention relates to an organic electroluminescent (EL) display assembly using an organic compound, and more particularly, to an organic EL display assembly wherein a sealing space for protecting an organic EL structure on a substrate contains a desiccant.

BACKGROUND OF THE INVENTION

Recently, active research works have been made on organic EL devices. As a basic configuration, the organic EL device includes a hole injecting electrode, a thin film formed thereon by evaporating a hole transporting material such as triphenyldiamine (TPD), a light emitting layer deposited thereon of a fluorescent material such as an aluminum quinolinol complex ($Alq_3$), and a metal electrode or electron injecting electrode formed thereon from a metal having a low work function such as magnesium. Such organic EL devices are attractive in that they can achieve a very high luminance ranging from several 100 to several 10,000 $cd/m^2$ with a drive voltage of approximately 10 volts.

Organic EL devices are very sensitive to moisture. Contact with moisture can cause serious problems including separation between the light emitting layer and the electrode layer, deterioration of constituent materials, formation of non-light-emitting zones known as dark spots, and reduction of the luminous area. As a result, the EL devices fail to maintain light emission of the desired quality.

One known solution to this problem is to shield an organic EL multilayer structure on a substrate from the exterior by tightly securing a gas-tight casing or sealing layer to the substrate so as to enclose the EL structure, as disclosed in JP-A 5-36475, 5-89959, and 7-169567.

Despite the provision of such casings or sealing layers, moisture gradually penetrates in the interior with the lapse of drive time whereby the devices deteriorate in several aspects, such as a drop of light emission luminance, generation or enlargement of dark spots, and reduction of the luminous area. Eventually the devices become unusable because of failure of light emission.

It was also proposed to accommodate the organic EL structure in a gas-tight casing in which a desiccant is contained. For example, JP-A 3-261091 discloses diphosphorus pentoxide ($P_2O_5$) as the desiccant. However, $P_2O_5$ tends to absorb moisture and becomes liquid (deliquescence) and thus forms phosphoric acid, which can be detrimental to the organic EL structure. The introduction of $P_2O_5$ into the casing requires a careful limited procedure. This technique is impractical.

JP-A 6-176867 discloses fine powdery solid desiccants such as zeolite, active alumina, silica gel, and calcium oxide. The desiccants of the type that physically adsorbs water, typically zeolite, release the once adsorbed water by the heat associated with the light emission of the organic EL device. The lifetime of the device is not fully long.

JP-A 9-148066 discloses desiccants in the form of compounds capable of chemically adsorbing moisture and maintaining a solid state even after moisture absorption, for example, alkali metal oxides, alkaline earth metal oxides, sulfates, and metal halides. Because of the chemical adsorption, once water is adsorbed, these compounds no longer release the water. The lifetime of the device is increased, but not to a satisfactory extent.

SUMMARY OF THE INVENTION

Therefore, an object of the invention is to provide an organic EL display assembly which is easy to fabricate, is protected from moisture and other deleterious elements, deteriorates little with time, and maintains the initial performance over a long period of time and hence, has a long lifetime.

According to the invention, there is provided an organic electroluminescent (EL) display assembly comprising a gas-tight casing, an organic EL structure received in the casing, and a desiccant disposed in the casing out of contact with the organic EL structure. The organic EL structure includes a hole injecting electrode, an electron injecting electrode, and at least one organic layer disposed between the electrodes. The desiccant is comprised of calcium hydride, strontium hydride or a mixture of calcium hydride and strontium hydride, preferably calcium hydride. Preferably, the gas-tight casing includes a substrate on which the organic EL structure is laid up, a sealing member disposed above and spaced from the organic EL structure, and a sealing adhesive for bonding the sealing member to the substrate. The space between the sealing member and the organic EL structure is preferably filled with nitrogen.

The organic EL display assembly of the invention includes an organic EL device in the form of an organic EL structure having a hole injecting electrode, an electron injecting electrode, and at least one organic layer disposed between the electrodes. The organic EL structure is received in a gas-tight casing. Calcium hydride and/or strontium hydride is disposed in the casing as a desiccant out of contact with the organic EL structure. By containing calcium hydride and/or strontium hydride as a desiccant in the gas-tight casing, the EL device is significantly increased in lifetime. This is because the desiccant picks up the moisture (or atmospheric water vapor) that will penetrate within the casing after its sealing so that the concentration of moisture within the casing is minimized.

Calcium hydride and strontium hydride pick up moisture according to the following reaction scheme.

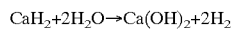

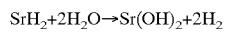

Since the compounds (or hydroxides) resulting from reaction with water are stable, the once picked up water is never released again. The use of calcium hydride and strontium hydride as the desiccant has the additional advantage that hydrogen generates along with water removal so that the interior of the gas-tight casing becomes a reducing atmosphere, which prevents the electrodes, especially the electron injecting electrode, from deterioration. Consequently, the lifetime of the EL device is further prolonged. The lifetime is long enough as compared with the use of the compounds described in JP-A 9-148066. Since an equimolar amount of hydrogen evolves upon adsorption of water vapor as understood from the reaction scheme, the change of the internal pressure within the gas-tight casing is little or nil, which is advantageous in maintaining the seal. The compounds described in JP-A 9-148066 are disadvantageous in this respect too.

Moreover, the desiccant used herein maintains a solid state even after moisture absorption. As long as the desiccant is disposed out of contact with the organic EL structure, the desiccant can exert no deleterious effect thereon. The desiccant can be easily contained in the casing.

BRIEF DESCRIPTION OF THE DRAWING

The only figure, FIG. 1 schematically illustrates the construction of an organic EL display assembly according to one embodiment of the invention.

DESCRIPTION OF THE PREFERRED EMBODIMENTS

Figure 1:
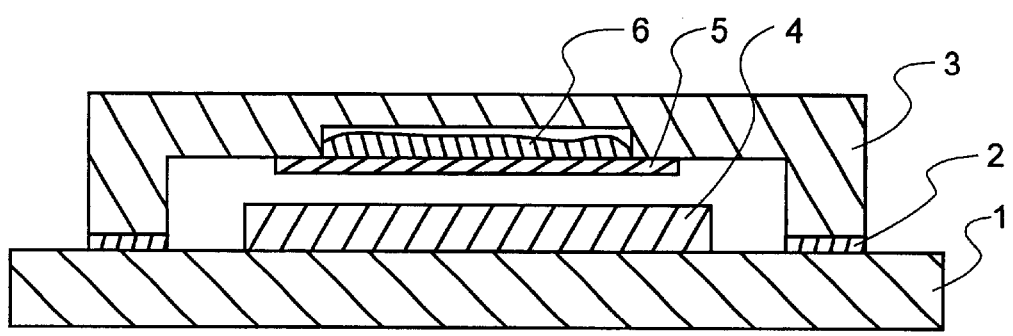

The organic EL display assembly of the invention includes an organic EL device in the form of an organic EL structure having a hole injecting electrode, an electron injecting electrode, and at least one organic layer disposed between the electrodes. The organic EL structure is received in a gas-tight casing. Either one or both of calcium hydride and strontium hydride are disposed in the casing out of contact with the organic EL structure. The initial composition of calcium hydride ($CaH_2$) and strontium hydride ($SrH_2$) as the desiccant may somewhat deviate from the stoichiometry. The desiccant is admitted into the casing in such a manner as to minimize its contact with atmospheric water vapor.

Equivalent effects are achieved when either of $CaH_2$ and $SrH_2$ is used. The use of aluminum lithium hydride ($AlLiH_4$) may be contemplated. However, since $AlLiH_4$ is highly reactive, argon (Ar) must sometimes be used as the sealing gas within the gas-tight casing. In this respect, $CaH_2$ is advantageous because it is compatible with nitrogen ($N_2$) as the sealing gas.

Calcium hydride and/or strontium hydride is preferably contained in the gas-tight casing in an amount of about 0.0001 mg to about 0.5 mg per cubic millimeter ($mm^3$) of the space in the casing. Less amounts of calcium hydride and strontium hydride would provide insufficient moisture removal. As the amount of calcium hydride and strontium hydride becomes larger, more moisture is removed and the lifetime of the display assembly is accordingly increased. If the desiccant comes in contact with the organic EL structure, the desiccant rather gives adverse effects. Usually the upper limit of the amount of the desiccant contained is about 1 $mg/mm^3$. When a mixture of calcium hydride and strontium hydride is used, the total amount should fall within the above-defined range.

Calcium hydride and strontium hydride may be used in the form of particles, which preferably have a mean particle size of about 0.01 to about 10 $\mu m$. Outside this range, a greater particle size corresponds to a smaller surface area and hence, a drop of water absorption. Particles with a smaller particle size are difficult to store and handle while keeping their water absorbing ability.

Calcium hydride and strontium hydride are disposed within the gas-tight casing so as to avoid contact with the organic EL structure. This is to avoid any deleterious effect on the organic EL structure. The manner of disposition is not critical. For example, a shaped body of calcium hydride and strontium hydride is fixedly secured within the gas-tight casing; calcium hydride and strontium hydride is contained in a gas-permeable bag or container made of porous Teflon® which is fixedly secured within the gas-tight casing; and a substrate or sealing plate is provided with a recess or partition where calcium hydride and strontium hydride is placed. Alternatively, calcium hydride and strontium hydride can be applied to the gas-tight casing as a thin or thick film by screen printing or reactive sputtering. The thickness of the film is preferably about 0.1 to 100 $\mu m$.

Referring to FIG. 1, the construction of the organic EL display assembly of the invention is described. The organic EL display assembly includes a substrate 1 an organic EL structure 4 laid up on the substrate 1, a sealing plate 3 disposed above and spaced from the organic EL structure, a spacer disposed along a connecting portion of the sealing plate 3 for keeping the sealing plate 3 at a predetermined distance from the substrate 1 to define a space, and a sealing adhesive 2 for securing the sealing plate 3 and sealing the organic EL structure. It is understood that the spacer is admixed in the adhesive. The space defined between the sealing plate 3 and the substrate 1 (organic EL structure 4) contains a desiccant 6 (calcium hydride and/or strontium hydride) out of contact with the organic EL structure 4 and is filled with a sealing or filler gas. In the illustrated embodiment, the desiccant 6 is disposed in a recess in the sealing plate 3 and retained there by a sheet 5 having gas and water vapor permeability. The desiccant may be held to the sealing plate 3 by similar means without forming a recess in the plate 3. Any desired retainer may be used for securing the desiccant within the space insofar as the desiccant is held so as to avoid contact with the organic EL structure 4.

As the filler gas within the gas-tight casing, inert gases such as argon (Ar), helium (He) and nitrogen ($N_2$) are used. When calcium hydride is used as the desiccant, nitrogen is preferred. When $AlLiH_4$ is used as the desiccant, argon is preferred because the use of nitrogen as the filler gas is prohibited at higher temperatures.

The filler gas should preferably have a water content of up to about 100 ppm, more preferably up to about 10 ppm, and most preferably up to about 1 ppm. The lower limit of the water content is not critical although it is usually about 0.1 ppm. The use of such filler gas restrains the hole injecting electrode, organic layer and electron injecting electrode of the organic EL structure themselves and at their interfaces from deterioration by chemical reaction with water, thereby maintaining the initial performance over a longer period of time.

The sealing plate is generally made of transparent or translucent materials such as glass, quartz and resins, with glass being preferred. As the glass material, preferred glass compositions are soda lime glass, lead alkali glass, borosilicate glass, aluminosilicate glass, and silica glass. The sealing plate is preferably a flat plate. The sealing plate may be provided with a recess where the desiccant is disposed as described above. Since the provision of a recess adds to the cost, inexpensive flat glass (or plate glass) is preferably used. The method of preparing glass plates includes roll-out, down-draw, fusion, and float methods. The preferred method for the surface treatment of glass plates is abrasive machining, $SiO_2$ barrier coating or the like. Among others, plates of soda lime glass prepared by the float method and not subject to surface treatment are preferred partially because of their low cost. Besides the plate glass, metal plates and plastic plates may be used as the sealing plate.

Means for adjusting the height of the sealing plate above the substrate is preferably a spacer though not limited thereto. The use of a spacer enables low-cost easy adjustment to the desired height. The spacer may be made of resin beads, silica beads, glass beads, and glass fibers, with the glass beads being especially preferred. The thickness of the spacer is preferably about 1 to 500 $\mu m$, more preferably about 1 to 200 $\mu m$, and most preferably about 1 to 20 $\mu m$ or about 100 to 200 $\mu m$.

Where the sealing plate is provided with a recess, the spacer may or may not be used. The spacer, if used, should preferably have a thickness as described just above, especially about 1 to 20 $\mu m$. The amount of adhesive applied varies with the size of the spacer although it is preferably about 1 to 100 $mg/cm^2$, more preferably 1 to 10 $mg/cm^2$.

The spacer is preferably used together with the sealing adhesive. With the sealing adhesive applied together, the spacer can be secured and sealed at the same time. The spacer is generally comprised of particles having a narrow particle size distribution while the shape of particles is not critical. Particles of various shapes may be used insofar as the spacer function is not impaired. It is understood that the adhesive itself may serve as the spacer, and that the spacer may be formed integrally with the sealing plate.

The adhesive is preferably a UV curable epoxy resin-base adhesive of the cation curing type. The materials of the respective layers of the organic EL multilayer structure generally have a glass transition temperature of less than about 140° C., especially about 80 to 100° C. If conventional adhesives of the thermosetting type having a curing temperature of about 140 to 180° C. are used, the organic EL structure softens upon curing of the adhesive, detracting from its characteristics. By contrast, UV curing type adhesives do not cause such softening of the organic EL structure. However, most UV curable adhesives commonly used at present are acrylic and thus have the problem that the acrylic monomer contained therein volatilizes upon curing and adversely affects the materials of the respective layers of the organic EL structure to deteriorate their characteristics. For this reason, a UV curable epoxy resin-base adhesive of the cation curing type which eliminates or substantially eliminates the above problem is used in the practice of the invention.

Among commercially available UV curable epoxy resin-base adhesives, epoxy resin-base adhesives of the combined UV/heat curing type are included. Most of these adhesives in which an acrylic resin of the radical curing type and an epoxy resin of the heat curing type are mixed or modified have not solved the problem of volatilization of acrylic monomer associated with the acrylic resins and the problem of curing temperature associated with the thermosetting epoxy resins. These adhesives are thus not suited for use with the organic EL device according to the invention.

The UV curable epoxy resin-base adhesive of the cation curing type is a composition comprising an epoxy resin as a base resin and a Lewis acid salt type curing agent capable of releasing a Lewis acid catalyst through photolysis upon exposure to light, typically ultraviolet radiation, as a main curing agent wherein the Lewis acid generated by light irradiation serves as a catalyst for the epoxy resin to polymerize through a cation polymerization type reaction mechanism until it is cured.

The epoxy resin as the base resin of the adhesive may be selected from among epoxidized olefin resins, alicyclic epoxy resins, and novolac epoxy resins. Examples of the curing agent include Lewis acid salts of aromatic diazonium, Lewis acid salts of diallyl iodonium, Lewis acid salts of triallyl sulfonium, and Lewis acid salts of triallyl selenium.

No particular limit is imposed on the height of the organic EL structure deposited on the substrate. Often, the organic EL structure preferably has a height of about 100 to 1,000 nm, more preferably about 300 to 800 nm. The distance from the surface of the substrate on which the organic EL structure is deposited to the lower surface of the sealing plate is preferably up to about 200 $\mu$m, more preferably about 80 to 150 $\mu$m.

Since the organic EL device is very sensitive to moisture, the securing of the sealing plate and the introduction of filler materials should preferably be carried out in an inert gas atmosphere such as dry nitrogen, argon or helium. Since the calcium hydride or strontium hydride desiccant is reactive with water, the desiccant which has been fully dried is preferably used in order to reduce the water content within the sealing space. The steps of depositing the organic EL structure, placing the desiccant and sealing are preferably carried out in-process without exposing to the ambient atmosphere.

Next, the organic EL structure constructing the organic EL device according to the invention is described. The organic EL structure includes on a substrate, a hole injecting electrode, an electron injecting electrode, and at least one organic layer disposed between the electrodes. The organic layer includes at least one hole transporting layer and at least one light emitting layer, on which the electron injecting electrode is disposed. A protective electrode may be disposed as the uppermost layer. The hole transporting layer may be omitted. The electron injecting electrode is made of a metal, compound or alloy having a low work function which is deposited by evaporation or sputtering, preferably sputtering.

A transparent electrode is preferred as the hole injecting electrode because a structure allowing emitted light to exit from the substrate side is typical. Useful materials for transparent electrodes include tin-doped indium oxide (ITO), zinc-doped indium oxide (IZO), zinc oxide (ZnO), tin oxide ($SnO_2$), and indium oxide ($In_2O_3$), with ITO and IZO being preferred. For ITO, an appropriate proportion of $SnO_2$ mixed with $In_2O_3$ is about 1 to 20%, more preferably about 5 to 12% by weight. For IZO, an appropriate proportion of ZnO mixed with $In_2O_3$ is about 1 to 20%, more preferably about 5 to 12% by weight. Additionally, Sn, Ti, Pb, etc. may be contained in the form of oxides in an amount of up to about 1% by weight calculated as oxide.

The hole injecting electrode may be formed by evaporation and other processes although it is preferably formed by a sputtering process. When sputtering is used in forming ITO and IZO electrodes, a target of $In_2O_3$ doped with $SnO_2$ or ZnO is preferably used. When a transparent ITO electrode is deposited by sputtering, it experiences a less change of luminance with time than an evaporated electrode. The preferred sputtering process is a DC sputtering process wherein the input power is preferably in the range of about 0.1 to 4 W/cm$^2$. The power of the DC sputtering equipment is preferably in the range of about 0.1 to 10 W/cm$^2$, especially about 0.2 to 5 W/cm$^2$. The deposition rate is preferably in the range of about 2 to 100 nm/min, especially about 5 to 50 nm/min.

The sputtering gas is not critical, and any of inert gases such as Ar, He, Ne, Kr, and Xe and mixtures thereof may be used. The pressure of the sputtering gas during sputtering is usually about 0.1 to about 20 Pa.

The hole injecting electrode may have a sufficient thickness for hole injection and is preferably about 5 to about 500 nm thick, especially about 10 to 300 nm thick.

The electron injecting electrode is preferably formed from materials having a low work function to ensure effective electron injection, for example, metal elements such as K, Li, Na, Mg, La, Ce, Ca, Sr, Ba, Al, Ag, In, Sn, Zn, Zr, Cs, Er, Eu, Ga, Hf, Nd, Rb, Sc, Sm, Ta, Y, and Yb, and compounds such as BaO, BaS, CaO, HfC, $LaB_6$, MgO, MoC, NbC, PbS, SrO, TaC, ThC, $ThO_2$, ThS, TiC, TiN, UC, UN, $UO_2$, $W_2C$, $Y_2O_3$, ZrC, ZrN, and $ZrO_2$. Also, binary or ternary alloys made of two or three such metal elements are preferred for stability improvement. Exemplary preferred alloys are aluminum base alloys such as Al—Ca (Ca: 5 to 20 at %), Al—In (In: 1 to 10 at %), Al—Li (Li: 0.1 to less than 20 at %), and Al—R wherein R is Y, Sc or rare earth elements; and In—Mg (Mg: 50 to 80 at %). Among others, elemental aluminum and aluminum base alloys such as Al—Li (Li: 0.4 to less than 6.5 at % or Li: 6.5 to 14 at %), and Al—R (R: 0.1 to 25 at %, especially 0.5 to 20 at %) are preferred because least compressive stresses are induced. Accordingly, the metal or alloy of which the electron injecting electrode is made is used as the sputtering target. Metals and alloys having a work function of up to 4.5 eV, especially up to 4.0 eV are preferred.

The use of the sputtering process in forming the electron injecting electrode has several advantages. The electron injecting electrode film formed by the sputtering process is improved in adhesion at the interface with the organic layer because as compared with the evaporation process, the sputtered atoms and atomic groups acquire relatively high kinetic energy so that the surface migration effect may occur. Also, since the surface oxide layer can be removed in vacuum by effecting pre-sputtering or the moisture and oxygen which have adsorbed on the organic layer interface can be removed by effecting back sputtering, it is possible to form a clean electrode-organic layer interface and a clean electrode and eventually, to fabricate an organic EL device of quality and stable performance. Alloys within the above-defined compositional range or elemental metals may be used as the target while targets of such alloys or metals with any desired component added are also acceptable. Further, even when a mixture of materials having significantly different vapor pressures is used as the target, there occurs only a slight shift in composition between the target and the film deposited therefrom, which eliminates the limits that are imposed on the materials by the vapor pressure or the like in the case of the evaporation process. The sputtering process is also advantageous in productivity as compared with the evaporation process, because it is unnecessary to supply the material for a long period of time and the resulting film is well uniform in thickness and quality.

Since the electron injecting electrode formed by the sputtering process is a dense film which minimizes the ingress of moisture as compared with an evaporated film of sparse packing, there can be obtained an organic EL device having high chemical stability and a long lifetime.

The pressure of the sputtering gas during sputtering is preferably in the range of about 0.1 to 5 Pa. By controlling the pressure of the sputtering gas within this range, an Al—Li alloy having a lithium concentration within the above-defined range can be easily obtained. Also, by changing the pressure of the sputtering gas within this range during film deposition, an electron injecting electrode having a graded lithium concentration as described above can be easily obtained. Furthermore, deposition conditions are preferably controlled such that the product of the substrate-to-target distance multiplied by the pressure of the sputtering gas may fall in the range of 20 to 65 Pa·cm The sputtering gas may be an inert gas as used in conventional sputtering apparatus, and in the case of reactive sputtering, a reactive gas such as $N_2$, $H_2$, $O_2$, $C_2H_4$ or $NH_3$ may be used in addition to the inert gas.

The sputtering process may be a high-frequency sputtering process using an RF power supply although a dc sputtering process is preferably used because the rate of film deposition is easily controllable and for the purpose of minimizing the damage to the organic EL device structure. The power to the dc sputtering apparatus is preferably in the range of about 0.1 to 10 W/cm$^2$, especially about 0.5 to 7 W/cm$^2$. Also, the rate of film deposition is preferably in the range of about 5 to 100 nm/min, especially about 10 to 50 nm/min.

The electron injecting electrode thin film should have a sufficient thickness for electron injection, typically at least 1 nm, preferably at least 3 nm. The upper limit of thickness is not critical although the film thickness generally ranges from about 3 nm to about 500 nm.

The organic EL device of the invention may include a protective electrode on the electron injecting electrode, that is, on the surface of the electron injecting electrode which is situated remote from the organic layer. The provision of the protective electrode is effective for protecting the electron injecting electrode from the surrounding atmosphere and moisture, preventing the thin films from deterioration, stabilizing the efficiency of electron injection, and remarkably increasing the lifetime of the device. The protective electrode has a very low resistivity so that it may serve as a wiring electrode in case the electron injecting electrode has a high resistivity. This protective electrode contains at least one of aluminum, a mixture of aluminum and a transition metal (excluding titanium), titanium and titanium nitride (TiN). When these components are used alone, it is preferred that the protective electrode contain about 90 to 100 at % of Al, about 90 to 100 at % of Ti or about 90 to 100 mol % of TiN. When a mixture of two or more components is used, the mix ratio of the components is not critical. When a mixture of aluminum and titanium is used, the mixture preferably contains up to 10 at % of Ti. Alternatively, layers each composed of a single component are laid up. In particular, aluminum or a mixture of aluminum and a transition metal gives better results when used as the wiring electrode as will be described later; and titanium nitride is highly corrosion resistant and thus effective as a sealing film. Titanium nitride (TiN) may deviate about 10% from its stoichiometry. The alloys of aluminum and a transition metal may contain transition metals such as Sc, Nb, Zr, Hf, Nd, Ta, Cu, Si, Cr, Mo, Mn, Ni, Pd, Pt and W, preferably in a total amount of up to 10 at %, more preferably up to 5 at %, and most preferably up to 2 at %. The lower the content of transition metal, the lower becomes the thin film resistance when the electrode serves as a wiring conductor.

The protective electrode has a thickness sufficient to ensure efficient electron injection and prevent ingress of moisture, oxygen and organic solvents, preferably a thickness of at least 50 nm, more preferably at least 100 nm, and especially 100 to 1,000 nm. Too thin a protective electrode layer would fail to achieve the above effects or to provide step coverage so that its connection to a terminal electrode becomes insufficient. Too thick a protective electrode layer would accumulate more stresses, resulting in an increased growth rate of dark spots. In the embodiment wherein the protective electrode serves as the wiring electrode, the thickness of the protective electrode is usually about 100 to 500 nm when the electron injecting electrode is thin and has a high film resistance and the protective electrode must compensate for that film resistance, and otherwise about 100 to 300 nm.

The total thickness of the electron injecting electrode and the protective electrode combined is preferably about 100 to 1,000 nm though not critical.

Following the electrode formation, a protective film may be formed in addition to the protective electrode, using an inorganic material such as SiOx or an organic material such as Teflon and chlorine-containing fluorinated hydrocarbon polymers. The protective film may be either transparent or opaque and have a thickness of about 50 to 1,200 nm. Apart from the reactive sputtering process mentioned above, the protective film may also be formed by an ordinary sputtering, evaporation or PECVD process.

Further, a sealing plate is provided on the device in order to prevent the organic layers and electrodes from oxidation. In order to prevent the ingress of moisture, the sealing plate is formed by attaching a glass plate to the substrate with the adhesive for sealing. Metal plates and plastic plates may also be used.

Next, the organic material layers included in the organic EL device of the invention are described.

The light emitting layer has the functions of injecting holes and electrons, transporting them, and recombining holes and electrons to create excitons. It is preferred that relatively electronically neutral compounds be used in the light emitting layer.

The hole injecting and transporting layer has the functions of facilitating injection of holes from the hole injecting electrode, transporting holes stably, and obstructing electron transportation. The electron injecting and transporting layer has the functions of facilitating injection of electrons from the electron injecting electrode, transporting electrons stably, and obstructing hole transportation. These layers are effective for increasing the number of holes and electrons injected into the light emitting layer and confining holes and electrons therein for optimizing the recombination region to improve light emission efficiency.

The thicknesses of the light emitting layer, the hole injecting and transporting layer, and the electron injecting and transporting layer are not critical and vary with a particular formation technique. Usually, their thickness is preferred to range from about 5 nm to about 500 nm, especially about 10 nm to about 300 nm.

The thickness of the hole injecting and transporting layer and the electron injecting and transporting layer is equal to or ranges from about 1/10 times to about 10 times the thickness of the light emitting layer although it depends on the design of a recombination/light emitting region. When the electron or hole injecting and transporting layer is divided into an injecting layer and a transporting layer, preferably the injecting layer is at least 1 nm thick and the transporting layer is at least 1 nm thick. The upper limit of thickness is usually about 500 nm for the injecting layer and about 500 nm for the transporting layer. The same film thickness applies when two injecting/transporting layers are provided.

The light emitting layer of the organic EL device of the invention contains a fluorescent material that is a compound having a light emitting capability. The fluorescent material may be at least one member selected from compounds as disclosed, for example, in JP-A 63-264692, such as quinacridone, rubrene, and styryl dyes. Also, quinoline derivatives such as metal complex dyes having 8-quinolinol or a derivative thereof as the ligand such as tris(8-quinolinolato)aluminum are included as well as tetraphenylbutadiene, anthracene, perylene, coronene, and 12-phthaloperinone derivatives. Further useful are phenylanthracene derivatives described in JP-A 8-12600 and the tetraarylethene derivatives described in JP-A 8-12969.

It is preferred to use such a compound in combination with a host material capable of light emission by itself, that is, to use the compound as a dopant. In this embodiment, the content of the compound in the light emitting layer is preferably 0.01 to 10% by weight, especially 0.1 to 5% by weight. By using the compound in combination with the host material, the light emission wavelength of the host material can be altered, allowing light emission to be shifted to a longer wavelength and improving the luminous efficacy and stability of the device.

As the host material, quinolinolato complexes are preferable, with aluminum complexes having 8-quinolinol or a derivative thereof as the ligand being more preferable. These aluminum complexes are disclosed in JP-A 63-264692, 3-255190, 5-70733, 5-258859 and 6-215874.

Illustrative examples include tris(8-quinolinolato)aluminum, bis(8-quinolinolato)magnesium, bis(benzo{f}-8quinolinolato)zinc, bis(2-methyl-8-quinolinolato) aluminum oxide, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Also useful are aluminum complexes having another ligand in addition to 8-quinolinol or a derivative thereof. Examples include bis(2-methyl-8-quinolinolato)(phenolato) aluminum(III), bis(2-methyl-8-quinolinolato) (orthocresolato)aluminum(III), bis(2-methyl-8-quinolinolato)(meta-cresolato)aluminum(III), bis(2-methyl-8quinolinolato)(para-cresolato)aluminum(III), bis(2-methyl8-quinolinolato)(ortho-phenylphenolato)aluminum (III), bis(2-methyl-8-quinolinolato)(meta-phenylphenolato) aluminum(III), bis(2-methyl-8-quinolinolato) (paraphenylphenolato)aluminum(III), bis(2-methyl-8-quinolinolato)(2,3-dimethylphenolato)aluminum(III), bis(2-methyl-8-quinolinolato)(2,6-dimethylphenolato)aluminum (III), bis(2-methyl-8-quinolinolato)(3,4-dimethylphenolato) aluminum(III), bis(2-methyl-8-quinolinolato)(3,5dimethylphenolato)aluminum(III), bis(2-methyl-8quinolinolato)(3,5-di-tert-butylphenolato)aluminum(III), bis(2-methyl-8-quinolinolato)(2,6-diphenylphenolato) aluminum(III), bis(2-methyl-8-quinolinolato)(2,4,6-triphenylphenolato)aluminum(III), bis(2-methyl-8-quinolinolato)( 2,3,6-trimethylphenolato)aluminum(III), bis (2-methyl-8-quinolinolato)(2,3,5,6-tetramethylphenolato) aluminum(III), bis(2-methyl-8-quinolinolato)(1-naphtholato)aluminum(III), bis(2-methyl-8-quinolinolato) (2-naphtholato)aluminum(III), bis(2,4-dimethyl-8-quinolinolato)(ortho-phenylphenolato)aluminum(III), bis(2, 4-dimethyl-8-quinolinolato)(para-phenylphenolato) aluminum(III), bis(2,4-dimethyl-8-quinolinolato) (metaphenylphenolato)aluminum(III), bis(2,4-dimethyl-8quinolinolato)(3,5-dimethylphenolato)aluminum(III), bis (2,4-dimethyl-8-quinolinolato)(3,5-di-tertbutylphenolato) aluminum(III), bis(2-methyl-4-ethyl-8-quinolinolato)(paracresolato)aluminum(III), bis(2-methyl-4-methoxy-8-quinolinolato)(para-phenylphenolato) aluminum(III), bis(2-methyl-5-cyano-8-quinolinolato)(orthocresolato)aluminum (III), and bis(2-methyl-6trifluoromethyl-8-quinolinolato)(2-naphtholato) aluminum(III).

Also acceptable are bis(2-methyl-8-quinolinolato) aluminum(III)-$\mu$-oxo-bis(2-methyl-8-quinolinolato) aluminum (III), bis(2,4-dimethyl-8-quinolinolato)aluminum (III)-$\mu$-oxo-bis(2,4-dimethyl-8-quinolinolato)aluminum (III), bis(4-ethyl-2-methyl-8-quinolinolato)aluminum(III)-$\mu$-oxo-bis(4 ethyl-2-methyl-8-quinolinolato)aluminum(III), bis(2-methyl-4-methoxyquinolinolato)aluminum(III)-$\mu$-oxo-bis(2-methyl-4-methoxyquinolinolato)aluminum(III), bis(5-cyano-2-methyl-8-quinolinolato)aluminum(III)-$\mu$-oxo-bis(5-cyano-2-methyl-8-quinolinolato)aluminum(III), and bis(2-methyl-5trifluoromethyl-8-quinolinolato) aluminum(III)-$\mu$-oxo-bis(2-methyl-5-trifluoromethyl-8-quinolinolato)aluminum(III).

Other useful host materials are the phenylanthracene derivatives described in JP-A 8-12600 and the tetraarylethene derivatives described in JP-A 8-12969.

The light emitting layer may also serve as the electron injecting and transporting layer. In this case, tris(8-quinolinolato)aluminum etc. are preferably used. These fluorescent materials may be evaporated.

Also, if necessary, the light emitting layer may also be a layer of a mixture of at least one hole injecting and transporting compound and at least one electron injecting and transporting compound, in which a dopant is preferably contained. In such a mix layer, the content of the dopant is preferably 0.01 to 20% by weight, especially 0.1 to 15% by weight.

In the mix layer, carrier hopping conduction paths are created, allowing carriers to move through a polarly predominant material while injection of carriers of opposite polarity is rather inhibited, and the organic compound becomes less susceptible to damage, resulting in the advantage of an extended device life. By incorporating the aforementioned dopant in such a mix layer, the light emission wavelength the mix layer itself possesses can be altered, allowing light emission to be shifted to a longer wavelength and improving the luminous intensity and stability of the device.

The hole injecting and transporting compound and electron injecting and transporting compound used in the mix layer may be selected from compounds for the hole injecting and transporting layer and compounds for the electron injecting and transporting layer to be described later, respectively. Inter alia, the compound for the hole injecting and transporting layer is preferably selected from amine derivatives having strong fluorescence, for example, triphenyldiamine derivatives which are hole transporting materials, styrylamine derivatives and amine derivatives having an aromatic fused ring.

The electron injecting and transporting compound is preferably selected from quinoline derivatives and metal complexes having 8-quinolinol or a derivative thereof as a ligand, especially tris(8-quinolinolato)aluminum (Alq3). The aforementioned phenylanthracene derivatives and tetraarylethene derivatives are also preferable.

For the hole injecting and transporting layer, amine derivatives having intense fluorescence are useful, for example, the triphenyldiamine derivatives, styrylamine derivatives, and amine derivatives having an aromatic fused ring, exemplified above as the hole transporting material.

The mix ratio is preferably determined in accordance with the carrier density and carrier mobility. It is usually preferred that the weight ratio of the hole injecting and transporting compound to the electron injecting and transporting compound range from about 1/99 to about 99/1, more preferably from about 10/90 to about 90/10, especially from about 20/80 to about 80/20.

Also preferably, the thickness of the mix layer ranges from the thickness of a mono-molecular layer to less than the thickness of the organic compound layer, specifically from 1 to 85 nm, more preferably 5 to 60 nm, especially 5 to 50 nm.

Preferably the mix layer is formed by a co-deposition process of evaporating the compounds from distinct sources. If both the compounds have approximately equal or very close vapor pressures or evaporation temperatures, they may be pre-mixed in a common evaporation boat, from which they are evaporated together. The mix layer is preferably a uniform mixture of both the compounds although the compounds can be present in island form. The light emitting layer is generally formed to a predetermined thickness by evaporating an organic fluorescent material or coating a dispersion thereof in a resin binder.

In the hole injecting and transporting layer, there may be used various organic compounds as described, for example, in JP-A 63-295695, 2-191694, 3-792, 5-234681, 5-239455, 5-299174, 7-126225, 7-126226, and 8-100172, and EP 06650955A1. Exemplary are tetraarylbenzidine compounds (triaryldiamines or triphenyldiamines: TPD), aromatic tertiary amines, hydrazone derivatives, carbazole derivatives, triazole derivatives, imidazole derivatives, oxadiazole derivatives having an amino group, and polythiophenes. Two or more of these compounds may be used, and on such combined use, they may be formed as separate layers or mixed.

Where the hole injecting and transporting layer is formed separately as a hole injecting layer and a hole transporting layer, two or more compounds are selected in a proper combination from the compounds commonly used in hole injecting and transporting layers. In this regard, it is preferred to laminate layers in such an order that a layer of a compound having a lower ionization potential may be disposed adjacent the hole injecting electrode (ITO). It is also preferred to use a compound having good thin film forming ability at the hole injecting electrode surface. The order of lamination also applies where a plurality of hole injecting and transporting layers are provided. Such an order of lamination is effective for lowering the drive voltage and preventing current leakage and the development and growth of dark spots. Since evaporation is utilized in the manufacture of devices, films as thin as about 1 to 10 nm can be formed uniform and pinhole-free, which restrains any change in color tone of light emission and a drop of efficiency by re-absorption even if a compound having a low ionization potential and absorption in the visible range is used in the hole injecting layer. Like the light emitting layer, the hole injecting and transporting layer may be formed by evaporating the above-mentioned compounds.

In the electron injecting and transporting layer which is optionally provided, there may be used quinoline derivatives including organic metal complexes having 8-quinolinol or a derivative thereof as a ligand such as tris(8-quinolinolato) aluminum (Alq3), oxadiazole derivatives, perylene derivatives, pyridine derivatives, pyrimidine derivatives, quinoxaline derivatives, diphenylquinone derivatives, and nitro-substituted fluorene derivatives. The electron injecting and transporting layer can also serve as the light emitting layer. In this case, use of tris(8-quinolinolato)aluminum etc. is preferred. Like the light emitting layer, the electron injecting and transporting layer may be formed by evaporation or the like.

Where the electron injecting and transporting layer is formed separately as an electron injecting layer and an electron transporting layer, two or more compounds are selected in a proper combination from the compounds commonly used in electron injecting and transporting layers. In this regard, it is preferred to stack layers in such an order that a layer of a compound having a greater electron affinity may be disposed adjacent the electron injecting electrode. The order of stacking also applies where a plurality of electron injecting and transporting layers are provided.

The substrate may be provided with a color filter film, a fluorescent material-containing color conversion film or a dielectric reflecting film for controlling the color of light emission.

The color filter film used herein may be a color filter as used in liquid crystal displays and the like. The properties of a color filter may be adjusted in accordance with the light emission of the organic EL device so as to optimize the extraction efficiency and color purity. It is also preferred to use a color filter capable of cutting external light of short wavelength which is otherwise absorbed by the EL device materials and fluorescence conversion layer, because the light resistance and display contrast of the device are improved. An optical thin film such as a dielectric multilayer film may be used instead of the color filter.

The fluorescence conversion filter film is to convert the color of light emission by absorbing electroluminescence and allowing the fluorescent material in the film to emit light. It is formed from three components: a binder, a fluorescent material, and a light absorbing material. The fluorescent material used may basically have a high fluorescent quantum yield and desirably exhibits strong absorption in the electro-luminescent wavelength region. In practice, laser dyes are appropriate. Use may be made of rhodamine compounds, perylene compounds, cyanine compounds, phthalocyanine compounds (including sub-phthalocyanines), naphthalimide compounds, fused ring hydrocarbon compounds, fused heterocyclic compounds, styryl compounds, and coumarin compounds. The binder is selected from materials which do not cause extinction of fluorescence, preferably those materials which can be finely patterned by photolithography or printing technique. Also, where the filter film is formed on the substrate so as to be contiguous to the hole injecting electrode, those materials which are not damaged during deposition of the hole injecting electrode (such as ITO or IZO) are preferable. The light absorbing material is used when the light absorption of the fluorescent material is short and may be omitted if unnecessary. The light absorbing material may also be selected from materials which do not cause extinction of fluorescence of the fluorescent material.

In forming the hole injecting and transporting layer, the light emitting layer, and the electron injecting and transporting layer, vacuum evaporation is preferably used because homogeneous thin films are available. By utilizing vacuum evaporation, there is obtained a homogeneous thin film which is amorphous or has a crystal grain size of less than 0.1 μm. If the grain size is more than 0.1 μm, uneven light emission would take place and the drive voltage of the device must be increased with a substantial drop of charge injection efficiency.

The conditions for vacuum evaporation are not critical although a vacuum of $10^{-4}$ Pa or lower and a deposition rate of about 0.01 to 1 nm/sec are preferred. It is preferred to successively form layers in vacuum because the successive formation in vacuum can avoid adsorption of impurities on the interface between the layers, thus ensuring better performance. Also, the drive voltage of a device can be reduced and the development and growth of dark spots be restrained.

In the embodiment wherein the respective layers are formed by vacuum evaporation, where it is desired for a single layer to contain two or more compounds, boats having the compounds received therein are individually temperature controlled to achieve co-deposition.

The organic EL device of the invention is generally of the dc drive type while it can be of the ac or pulse drive type. The applied voltage is generally about 2 to 20 volts.

EXAMPLE

Examples of the present invention are given below by way of illustration and not by way of limitation.

Example 1

A passive matrix light emitting device was fabricated as follows.

On a 7059 glass substrate (Corning Glass Works), a transparent ITO electrode (or hole injecting electrode) was deposited to a thickness of 85 nm and patterned so as to define pixels in a matrix of 64×256 dots (each pixel sized 280×280 pm). The substrate having the patterned hole injecting electrode was subjected to ultrasonic washing with neutral detergent, acetone, and ethanol, pulled up from boiling ethanol, and dried. The surface was further cleaned with UV/ozone. Thereafter, the substrate was secured by a holder in a vacuum evaporation chamber, which was evacuated to a vacuum of $1\times10^{-4}$ Pa or lower. 4,4',4"-tris(N-(3-methylphenyl)-N-phenylamino)triphenylamine (m-MTDATA) was evaporated at a deposition rate of 0.2 nm/sec. to a thickness of 40 nm, forming a hole injecting layer. Then, N,N'-diphenyl-N,N'-m-tolyl-4,4'-diamino-1,1'-biphenyl (TPD) was evaporated at a deposition rate of 0.2 nm/sec to a thickness of 35 nm, forming a hole transporting layer. Then, tris(8-quinolinolato)aluminum (Alq3) was evaporated at a deposition rate of 0.2 nm/sec to a thickness of 50 nm, forming an electron injecting and transporting/light emitting layer. Next, MgAg was co-evaporated at a deposition rate ratio Mg:Ag=1:10 to a thickness of 200 nm (dual-source evaporation), forming an electron injecting electrode. Finally, by DC sputtering using an aluminum target, a protective electrode of aluminum was deposited to a thickness of 200 nm.

The glass substrate on which the organic EL structure was deposited was transferred to a glove box through which nitrogen gas was passed. An epoxy resin adhesive of the UV curing type (30Y296D by Three Bond K.K.) in an uncured state, 100 mg, was applied to the glass substrate. A mesh bag containing $CaH_2$ particles as a desiccant was secured to a sealing plate of 7059 glass (Corning Glass Works). The sealing plate was laid on the substrate to define a gas-tight space of about 100 μm in height. A pressure of 3 kg/cm² was applied to the assembly while the glass plates were slid back and forth, thereby forming a thin layer of adhesive between the glass substrate and the sealing plate. Since the adhesive was filled with 1% by weight of spacer beads with a size of 7 μm, the adhesive layer was formed to a thickness of 7 μm. UV radiation was irradiated to cure the adhesive, completing an organic EL display assembly. The amount of the desiccant was 0.01 mg/mm³ of the space within the gas-tight casing.

With a dc voltage applied in the ambient atmosphere, the organic EL display assembly was continuously driven at a constant current density of 10 mA/cm² for 1,000 hours under accelerated conditions including a temperature of 60° C. and a relative humidity of 95%. The enlargement of a nonlight-emitting area was examined. After 1,000 hour of drive, this organic EL display assembly showed a non-light-emitting area factor within 10%. The non-light-emitting area factor was calculated as (non-light-emitting area)/(pixel area)× 100%.

Example 2

An organic EL display assembly was fabricated as in Example 1 except that the same amount of $SrH_2$ was used instead of $CaH_2$ as the desiccant. It was similarly examined, finding a non-light-emitting area factor within 10% after 1,000 hour of drive.

Comparative Example 1

An organic EL display assembly was fabricated as in Example 1 except that the same amount of BaO was used instead of $CaH_2$ as the desiccant. It was similarly examined. After 1,000 hour of drive, it showed a non-light-emitting area factor of more than 30%, failing to function as a display.

As compared with the comparative organic EL display assembly using BaO as the desiccant, the organic EL display assemblies within the scope of the invention are minimized in the enlargement of non-light-emitting area and have a longer lifetime.

There has been described an organic EL display assembly which is easy to fabricate, substantially eliminates the influence of moisture and other deleterious elements, deteriorates little with time, and maintains the initial performance over a long period of time and hence, has a long lifetime.

Japanese Patent Application No. 10-181458 is incorporated herein by reference.

The invention has been described in detail with particular reference to preferred embodiments thereof, but it will be understood that variations and modifications can be effected within the spirit and scope of the invention.

What is claimed is:

1. An organic electroluminescent display assembly comprising a gas-tight casing, an organic electroluminescent structure received in the casing and comprising a hole injecting electrode, an electron injecting electrode, and at least one organic layer disposed between the electrodes, and a desiccant disposed in the casing out of contact with said organic electroluminescent structure, the desiccant comprising calcium hydride, strontium hydride or a mixture of calcium hydride and strontium hydride.

2. The assembly of claim 1 wherein said gas-tight casing comprises a substrate on which said organic electroluminescent structure is laid up, a sealing member disposed above and spaced from said organic electroluminescent structure, and a sealing adhesive for bonding said sealing member to said substrate.

3. The assembly of claim 2 wherein the space between said sealing member and said organic electroluminescent structure is filled with nitrogen, and said desiccant is calcium hydride.

* * * * *